United States Patent
de Souza et al.

(10) Patent No.: US 10,157,993 B2
(45) Date of Patent: *Dec. 18, 2018

(54) LOW RESISTANCE CONTACT FOR SEMICONDUCTOR DEVICES

(71) Applicant: INTERNATIONAL BUSINESS MACHINES CORPORATION, Armonk, NY (US)

(72) Inventors: Joel P. de Souza, Putnam Valley, NY (US); Keith E. Fogel, Hopewell Junction, NY (US); Jeehwan Kim, Cambridge, MA (US); Devendra K. Sadana, Pleasantville, NY (US); Brent A. Wacaser, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/183,336

(22) Filed: Jun. 15, 2016

(65) Prior Publication Data

US 2016/0300925 A1   Oct. 13, 2016

Related U.S. Application Data

(62) Division of application No. 14/656,089, filed on Mar. 12, 2015.

(51) Int. Cl.
*H01L 29/66* (2006.01)
*H01L 21/265* (2006.01)
(Continued)

(52) U.S. Cl.
CPC .... *H01L 29/66446* (2013.01); *H01L 21/2654* (2013.01); *H01L 21/28008* (2013.01);
(Continued)

(58) Field of Classification Search
CPC .............. H01L 29/66636; H01L 29/78; H01L 29/66969; H01L 29/267; H01L 29/66446;
(Continued)

(56) References Cited

U.S. PATENT DOCUMENTS 5,889,295 A * 3/1999 Rennie .................... H01L 33/28
257/102
6,313,534 B1   11/2001 Nakamura et al.
(Continued)

FOREIGN PATENT DOCUMENTS

CN   101361189 A   2/2009
CN   101771076 A   7/2010
(Continued)

OTHER PUBLICATIONS

Bashar, S., "Study of indium tin oxide (ITO) for novel optoelectronic devices", PhD Thesis, University of London, UK. 1998. (278 Pages).
(Continued)

*Primary Examiner* — David Spalla
(74) *Attorney, Agent, or Firm* — Tutunjian & Bitetto, P.C.; Erik Johnson

(57) ABSTRACT

A semiconductor device includes a substrate and a p-doped layer including a doped III-V material on the substrate. An n-type material is formed on or in the p-doped layer. The n-type layer includes ZnO. An aluminum contact is formed in direct contact with the ZnO of the n-type material to form an electronic device.

16 Claims, 3 Drawing Sheets

(51) Int. Cl.
    *H01L 21/28*    (2006.01)
    *H01L 29/08*    (2006.01)
    *H01L 29/267*   (2006.01)
    *H01L 29/43*    (2006.01)

(52) U.S. Cl.
    CPC ........ *H01L 29/0847* (2013.01); *H01L 29/267* (2013.01); *H01L 29/66522* (2013.01); *H01L 29/43* (2013.01)

(58) Field of Classification Search
    CPC . H01L 29/66522; H01L 29/861; H01L 23/48; H01L 23/482; H01L 23/4827; H01L 23/485; H01L 23/52; H01L 23/522; H01L 23/5226; H01L 23/528; H01L 23/532; H01L 23/53204; H01L 23/53271
    See application file for complete search history.

(56) References Cited

U.S. PATENT DOCUMENTS

| | | | |
|---|---|---|---|
| 7,238,972 B2 | 7/2007 | Lee et al. | |
| 7,285,857 B2 | 10/2007 | Kwak et al. | |
| 9,620,592 B2* | 4/2017 | de Souza | H01L 29/78 |
| 2006/0226443 A1* | 10/2006 | Ryu | H01L 29/1608 257/192 |
| 2013/0200443 A1 | 8/2013 | Lavoie et al. | |
| 2015/0028428 A1 | 1/2015 | Lin et al. | |
| 2016/0093701 A1* | 3/2016 | DeSouza | H01L 29/267 257/43 |
| 2016/0118303 A1* | 4/2016 | Kuo | H01L 29/66636 257/368 |
| 2016/0240620 A1* | 8/2016 | de Souza | H01L 29/78 |

FOREIGN PATENT DOCUMENTS

| | | |
|---|---|---|
| DE | 69937565 T2 | 3/2008 |
| WO | 2013095523 A1 | 6/2013 |

OTHER PUBLICATIONS

Chang et al., "High κ/InGaAs for Ultimate CMOS—Interfacial Passivation, Low Ohmic Contacts, and Device Performances", Invited paper in ECS Transactions, vol. 61 No. 2, May 2014. (pp. 113-124).

Chang, W.H. et al., "Optimization of Ohmic metal contacts for advanced GaAs-based CMOS device", Journal of Vacuum Science & Technology B No. 30. Feb. 2012. (5 Pages).

Czornomaz, L. et al., "CMOS compatible self-aligned S/D regions for implant-free InGaAs MOSFETs", Solid-State Electronics, No. 74. Apr. 2012. (pp. 71-76).

Egard, M. et al., "High transconductance self-aligned gate-last surface channel In0.53Ga0.47As MOSFET," PElectron Devices Meeting (IEDM), 2011 IEEE International, Dec. 2011. (4 Pages).

Guo, H.X. et al., "Ge/Ni—InGaAs Solid-State Reaction for Contact Resistance Reduction on n+ in 0.75 Ga 0.25 As", Japanese Journal of Applied Physics. No. 51. Feb. 2012. (pp. 1-5).

Hu, J., "Device Technology for Nanoscale III-V Compound Semiconductor Field Effect Transistors", Doctoral dissertation, Stanford University, Dec. 2011, (161 Pages).

Kong, E. et al., "Investigation of Pd—InGaAs for the formation of self-aligned source/drain contacts in InGaAs metal-oxide-semiconductor field-effect transistors", Solid-State Electronics, vol. 85. May 2013. (pp. 36-42).

Liao, M.H. et al., "Experimental demonstration for the implant-free In0.53Ga0.47As quantum-well metalinsulator-semiconductor field-effect transistors with ultra-low source/drain resistance", Applied Physics Letters 103. Aug. 2013. (4 Pages).

Oh, J. et al., "Au-free SI MOS compatible Ni/Ge/Al ohmic contacts to n+-InGaAs", Phys. Status Solidi A, Jan. 2015. (pp. 1-5).

Ou, F. et al., "Ohmic Contact of Cadmium Oxide, a Transparent Conducting Oxide, to n-type Indium Phosphide", ACS Appl. Mater. Interfaces, vol. 3 No. 4, Mar. 2011. (pp. 1341-1345).

Singisetti, U. et al., "InGaAs channel MOSFET with self-aligned source/drain MBE regrowth technology", Physica status solidi (c), vol. 6. No. 6, Jan. 2009.(pp. 1394-1398).

Wang, R. et al., "Schottky-barrier height modulation of metal/In0.53Ga0.47As interfaces by insertion of atomic-layer deposited ultrathin Al 2O3.", Journal of Vacuum Science & Technology B: Microelectronics and Nanometer Structures, vol. 29 No. 4, Aug. 2011. (4 Pages).

Xuan, Y. et al., "High-performance surface channel In-rich in 0.75 Ga 0.25 As MOSFETs with ALD high-k as gate dielectric", Electron Devices Meeting, 2008. IEDM 2008. IEEE International, Dec. 2008. (4 Pages).

Yang S. et al., "Ohmic contact formation process on low n-type gallium arsenide (GaAs) using indium gallium zinc oxide (IGZO)", Materials Research Bulletin No. 50, Nov. 2013. (pp. 409-412).

Zhang, X. et al., "A gate-last in 0.53 Ga 0.47 As channel FinFET with Molybdenum source/drain contacts", Proceedings of the IEEE European Solid-State Device Research Conference, Sep. 2012. (pp. 177-180).

Zhang, X. et al., "Multiple-gate in 0.53 Ga 0.47 As channel n-MOSFETs with self-aligned Ni-InGaAs contacts", ECS Journal of Solid State Science and Technology, vol. 1 Issue 2, May 2012. (pp. 82-85).

Zhang, X. et al., "In 0.53 Ga 0.47 As FinFETs with self-aligned molybdenum contacts and HfO2/Al2O3 gate dielectric", Solid-State Electronics, vol. 84, Jun. 2013. (pp. 83-89).

Zhou, X. et al., "High-performance implant-free InGaAs MOSFETs on GaAs substrate grown by MOCVD", Proc. 10th IEEE International Conference on Solid-State and Integrated Circuit Technology (ICSICT), Nov. 2010. (pp. 1377-1379).

Chinese Office Action issued in Chinese Application No. 201610140176.6 dated Jun. 28, 2018.

* cited by examiner

US 10,157,993 B2

LOW RESISTANCE CONTACT FOR SEMICONDUCTOR DEVICES

BACKGROUND

Technical Field

The present invention relates to semiconductor devices and processes, and more particularly to semiconductor devices that employ doped ZnO with InGaAs metal oxide semiconductor devices to reduce contact resistance.

Description of the Related Art

Field effect transistors (FETs) which employ III-V materials, such as GaAs, InP or InGaAs substrates, often include a doped source and drain region made of a similar material. In one common structure, III-V FETs include source/drain (S/D) regions formed from doped InGaAs (e.g., n+ InGaAs). n+ InGaAs is not ideal for S/D regions. In InGaAs nFETs, the n+ InGaAs S/D regions suffer from a low doping concentration (e.g., $1 \times 10^{19}$ cm$^{-3}$). In addition, there is relatively high junction leakage and high contact resistance in InGaAs S/D regions. Further, the formation process requires patterned implantation of n+ dopants, which adds time and expense to the process, and may result in junction damage.

These III-V FET structures often include metal contacts on the n+ InGaAs S/D regions. The metal contacts may include Ti, Pd, Au or Ni, and have a contact resistance (resistivity) that exceeds $5 \times 10^{-8}$ Ohm-cm$^2$. This significantly falls short of the desired contact resistance (resistivity) of less than $5 \times 10^{-9}$ Ohm-cm$^2$.

SUMMARY

A semiconductor device includes a substrate and a p-doped layer including a doped III-V material on the substrate. An n-type material is formed on or in the p-doped layer. The n-type layer includes ZnO. An aluminum contact is formed in direct contact with the ZnO of the n-type material to form an electronic device.

Another semiconductor device includes a substrate and a p-doped layer including a doped III-V material on the substrate. An n-type material is formed on or in the p-doped layer, the n-type material including a doped III-V material. A contact is formed on the n-type material and includes an interlayer formed from ZnO and an aluminum portion formed in direct contact with the ZnO of the interlayer to form an electronic device.

A method for forming a semiconductor device includes forming a p-doped layer including a doped III-V material on a substrate; forming an n-type material on or in the p-doped layer; and forming a contact on the n-type material, the contact including a ZnO and aluminum interface to reduce contact resistivity to less than about $5 \times 10^{-9}$ Ohm-cm$^2$.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
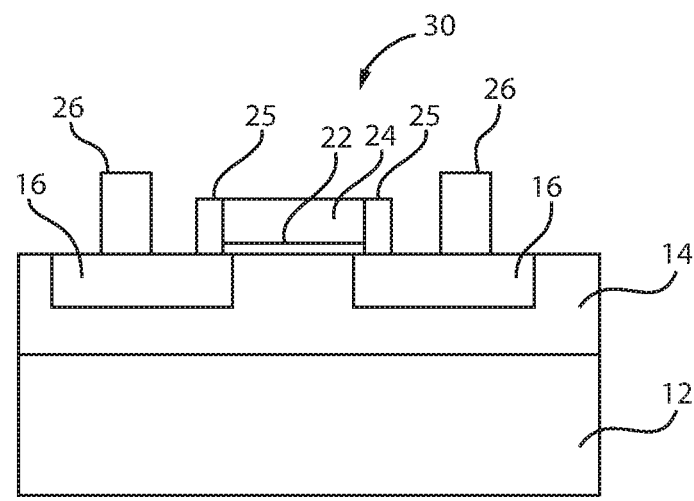
FIG. 1 is a cross-sectional view of a partially fabricated field effect transistor with a ZnO n-type layer forming source and drain regions with an aluminum contact to reduce contact resistance in accordance with the present principles.

In accordance with the present principles, electronic devices, structures and methods for formation are described for replacing n-doped semiconductor materials with doped ZnO or forming a doped ZnO interlayer between the n-doped semiconductor materials and a contact to reduce contact resistance. Doped ZnO, and in particular, n$^+$ Al-doped ZnO (ZnO:Al or AZO) provides a replacement material for source and drain regions, active layers in diodes, etc. ZnO:Al has a similar electron affinity (~4.35-~4.4 eV) as n+ InGaAs, which is ~4.5 eV. ZnO:Al has a greater doping level that can be obtained, for example, up to about $5 \times 10^{21}$/cm$^3$. ZnO:Al processing is more compatible with metallization processing. For example, S/D regions may include metal layers formed thereon. ZnO:Al is more compatible with the metal material employed in forming these structures.

The formation of ZnO:Al also tends to be easier. For example, instead of epitaxial growth processes with patterned doping (e.g., for n+ InGaAs), ZnO:Al may be formed using atomic layer deposition (ALD), although other processes may be employed. This permits a doped layer with less surface damage. Materials like Al may be formed directly on the ZnO to form a contact with significantly reduced contact resistance.

It is to be understood that the present invention will be described in terms of a given illustrative architecture; however, other architectures, structures, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip in accordance with the present principles may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., InP, InGaAs or ZnO. These compounds may include different proportions of the elements within the compound, e.g., InGaAs includes $In_xGa_{1-x}As$, where x is less than or equal to 1, or ZnO includes $Zn_xO_{1-x}$ where x is less than or equal to 1, etc. In addition, other elements may be included in the compound, such as, e.g., ZnO:Al, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-section of a partially fabricated field effect transistor (FET) 10 is shown in accordance with one illustrative example. The FET 10 includes a substrate 12, a p-doped layer 14 and n-type source and drain regions 16. While the structures described and shown in accordance with the present principles are particularly useful for n-FETs, doping changes and materials may be adjusted to implement the present principles in p-FET devices as well. In one embodiment, the substrate 12 may include a III-V material, silicon material or other suitable substrate or wafer material. Some embodiments implement a III-V material (e.g., for the p-doped layer 14 and/or the n-type material 16) grown on a Si substrate 12.

The p-doped layer 14 may include a p-doped InGaAs layer although other III-V materials may be employed. In conventional devices, the source/drain (S/D) regions would normally include regrown III-V materials formed using epitaxy with patterned doped regions by implantation processes.

In accordance with useful embodiments, a II-VI material may be employed for S/D regions 16. In particular, an n-type material, such as, ZnO or its alloys may be employed. ZnO can be generically applied to III-V materials with matching work functions. n-type material 16 may have a band gap of about 1 eV or less. While the ZnO can be employed to replace, InGaAs or other III-V materials, ZnO can be employed for the semiconductor materials whose band gap is less than 1 eV, e.g., on Ge or similar materials.

A range of n-doping in ZnO is up to 2 atomic percent (e.g., $\sim 5\times 10^{21}/cm^3$). ZnO dopants may include Al, B, Ga, In, etc, with Al:ZnO being preferred. ZnO may be deposited or grown by one or more of the following processes, epitaxy, sputtering, atomic layer deposition (ALD) and metal organic chemical vapor deposition (MOCVD). The ZnO preferably includes n+ ZnO:Al deposited by ALD. The ALD process forms the S/D regions 16 to provide less surface damage to underlying layers including layer 14. In addition, higher doping concentrations for the S/D regions 16 can be achieved with better stoichiometric control. In one example, the ALD process may include the use of a 13 cycle Zn deposition to 1 cycle Al deposition. The carrier concentration (electron density) of the S/D regions 16 may be between about $1\times10^{21}$ cm$^{-3}$ to about $5\times10^{21}$ cm$^{-3}$, and preferably about $3.0\times10^{21}$ cm$^{-3}$ for doped Aluminum Zinc Oxide (ZnO:Al) (AZO).

The n-type material 16 (e.g., ZnO:Al) is preferably crystalline in form. This includes a monocrystalline structure and may include a multi-crystal structure or other crystalline structure (micro, nano, etc.). However, the AZO material of layer 16 may also include amorphous phases. In one embodiment, the ZnO of layer 16 is amorphous. The underlying layers, e.g., p-doped layer 14 and substrate 12 are also preferably crystalline, but may include other phases.

The FET 10 is further processed by forming a gate dielectric 22, e.g., HfO$_2$, Al$_2$O$_3$, or other high dielectric constant material and/or insulating layers. A gate electrode 24 is then formed. The gate electrode 24 may include any suitable highly conductive material, e.g., Cu, Cr, Au, Ag, etc. The gate dielectric 22 and the gate conductor 24 may be formed prior to the formation of the S/D regions 16. In one embodiment, a gate structure 30 (e.g., gate dielectric 22, the gate conductor 24, spacers 25, etc.) may be employed to locate the S/D regions 16 (e.g., act as an etch mask for removing portions of layer 14 and/or act as a deposition mask for the II-VI material for the S/D regions 16).

Contacts 26 are formed on the S/D regions 16. The contacts 26 may include aluminum or other metals. Metals are more compatible with materials for S/D regions 16 than the III-V materials employed in conventional devices. The FET 10 may include metal contacts in a bi-layer arrangement, e.g., Al and Au. An Al liner may be placed on the S/D regions 16 followed by a highly conductive material such as Au or Pt. Other metals or combinations of metals are also contemplated. The Al (or other metal layer) may be employed as a dopant source for doping or further doping the underlying S/D regions 16. An anneal process may be performed to assist in doping the S/D regions 16 with contact metals.

Figure 2:
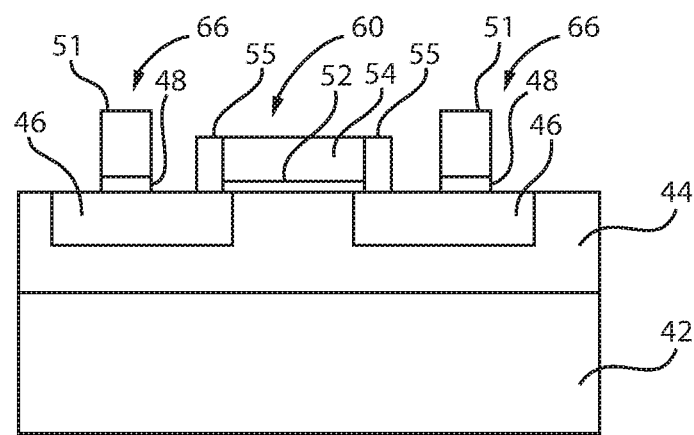
FIG. 2 is a cross-sectional view of a partially fabricated field effect transistor with a ZnO interlayer formed on an n-type III-V layer forming source and drain regions with an aluminum portion on the interlayer to reduce contact resistance in accordance with the present principles.

Referring to FIG. 2, a cross-section of a partially fabricated field effect transistor (FET) 40 is shown in accordance with another illustrative example. The FET 40 includes a substrate 42, a p-doped layer 44 and n-type source and drain regions 46. While the structures described and shown in accordance with the present principles are particularly useful for n-FETs, doping changes and materials may be adjusted to implement the present principles in p-FET devices as well. In one embodiment, the substrate 42 may include a III-V wafer, silicon material or other suitable material or wafer. Some embodiments implement a III-V material (e.g., for the p-doped layer 44 and/or the n-type layer 46) grown on a Si substrate 42.

The p-doped layer 44 may include a p-doped InGaAs layer although other III-V materials may be employed. The n-doped layer 46 may include an n+ doped InGaAs layer although other III-V materials may be employed. The source/drain (S/D) regions 46 include regrown III-V materials formed using epitaxy with patterned doped regions by implantation processes or in-situ doping.

In accordance with useful embodiments, a II-VI material may be employed for an interlayer 48 formed on S/D regions 46. The interlayer 48 is part of a contact 66 connecting to S/D regions 46. In particular, an n-type material, such as, ZnO or its alloys may be employed for interlayer 48. ZnO can be generically applied to III-V materials with matching work functions. n-type layer 48 may have a band gap of about 1 eV or less.

A range of n-doping in ZnO is up to 2 atomic percent (e.g., $\sim 5 \times 10^{21}/cm^3$). ZnO dopants may include Al, B, Ga, In, etc., with Al:ZnO being preferred. ZnO may be deposited or grown by one or more of the following processes, epitaxy, sputtering, atomic layer deposition (ALD) and metal organic chemical vapor deposition (MOCVD). The ZnO preferably includes n+ ZnO:Al deposited by ALD. The ALD process forms the S/D regions 46 to provide less surface damage to underlying layers including layer 44.

The n-type material of interlayer 48 (e.g., ZnO:Al) is preferably crystalline in form. This includes a monocrystalline structure and may include a multi-crystal structure or other crystalline structure (micro, nano, etc.). However, the AZO material of layer 48 may also include amorphous phases. In one embodiment, the ZnO of layer 48 is amorphous, which is easier to form and process. The underlying layers, e.g., n-doped layer 46, p-doped layer 44 and substrate 42 are also preferably crystalline, but may include other phases.

The FET 40 is further processed by forming a gate dielectric 52, e.g., $HfO_2$, $Al_2O_3$, or other high dielectric constant material, and/or insulating layers. A gate electrode 54 is then formed. The gate electrode 54 may include any suitable highly conductive material, e.g., Cu, Cr, Au, Ag, etc. The gate dielectric 52 and the gate conductor 54 may be formed prior to the formation of the S/D regions 46. In one embodiment, a gate structure 60 (e.g., gate dielectric 52, the gate conductor 54, spacers 55, etc.) may be employed to locate the S/D regions 46 (e.g., act as an etch mask for removing portions of layer 44 and/or act as a deposition mask for the III-V material for the S/D regions 46).

Contacts 66 are formed on the S/D regions 46. The contacts 66 include the interlayer 48 and a metal portion 51, e.g., aluminum. The FET 40 may include interlayer 48 in a bi-layer or tri-layer arrangement, e.g., ZnO and Al (and/or Au on the Al), etc.). The metal layer (e.g., Al) 51 may be placed on the interlayer 48, which is formed on the S/D regions 46. The metal layer 51 may also include a highly conductive material such as Au or Pt formed thereon. Other metals or combinations of metals are also contemplated.

It should be understood that in one particularly useful embodiment, the ZnO material of the S/D regions 16 (FIG. 1) or the interlayer 48 (FIG. 2), preferably directly connects to Al metal to form a contact or a portion of a contact. The ZnO:Al to Al interface provides a low contact resistance connection as will be described hereinafter.

Figure 3:
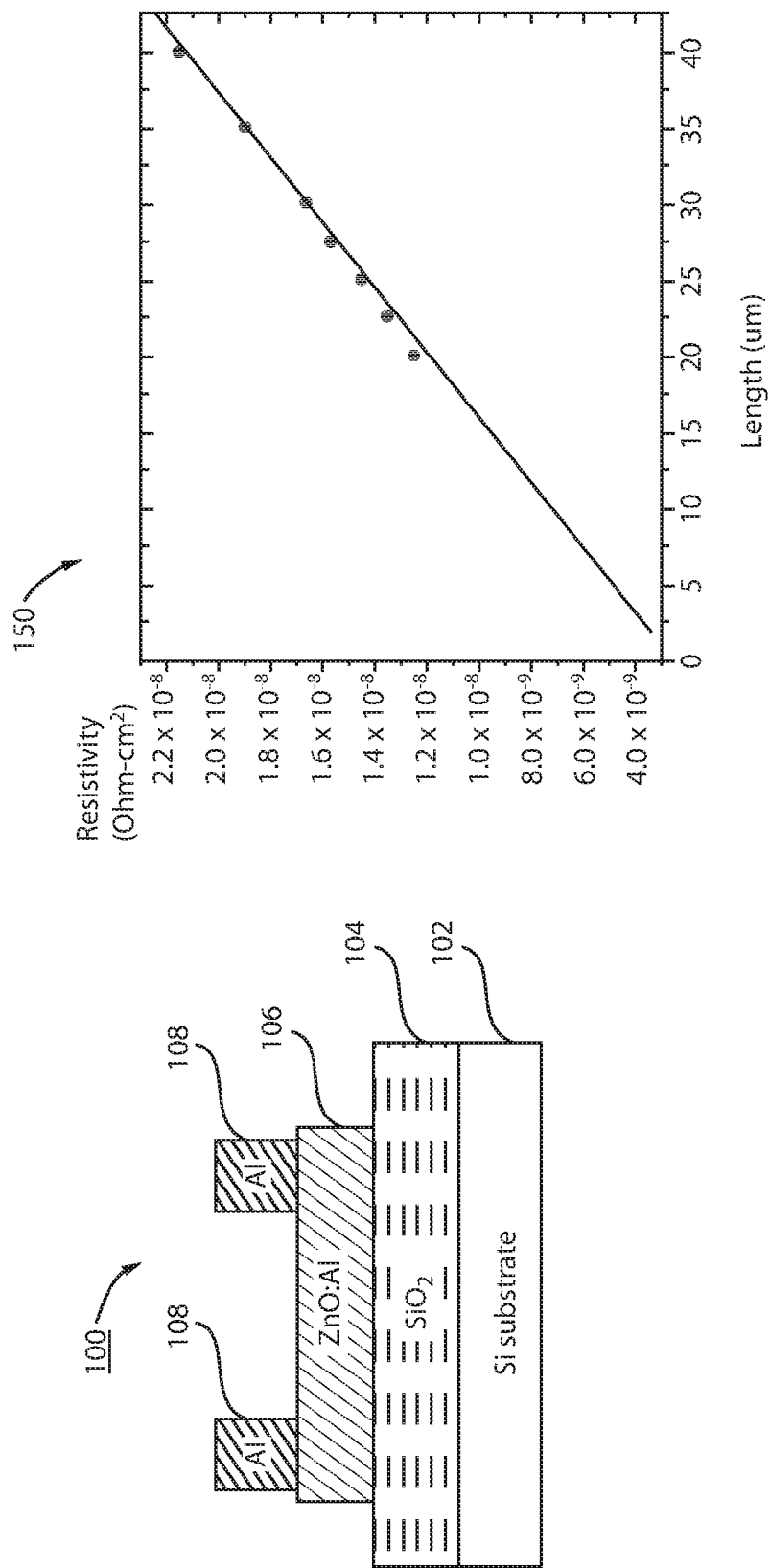
FIG. 3 is a cross-sectional view of a device employed for recording contact resistance and a graph plotting resistivity (Ohm-cm$^2$) versus length (microns) for the device in accordance with the present principles.

Referring to FIG. 3, a test structure 100 is depicted that was employed by the inventors to demonstrate contact resistance characteristics obtained by an Al—ZnO:Al contact in accordance with one embodiment. The structure includes a Si substrate 102 having a dielectric layer 104 formed from $SiO_2$ deposited on the substrate 102. A layer 106 of ZnO:Al is formed on the dielectric layer 104, and contacts 108 were patterned on the ZnO:Al layer 106. Contact resistance was measured between the contacts 108.

A plot 150 of resistivity (Ohm-$cm^2$) versus length (microns) between the contacts 108 is graphed. The graph shows a linear relationship between resistivity and length.

Conventional III-V FET structures with metal contacts (e.g., Ti, Pd, Au or Ni) on the n+ InGaAs S/D regions have a contact resistance (resistivity) that exceeds $5 \times 10^{-8}$ Ohm-$cm^2$. In accordance with the present principles, the Al—ZnO:Al interface provides a contact resistance of less than about $1.3 \times 10^{-9}$ Ohm-$cm^2$. This falls within the desired contact resistance (resistivity) of less than $5 \times 10^{-9}$ Ohm-$cm^2$.

It should be understood that the present principles have been illustratively demonstrated using a transistor structure; however, the contact structure may be employed with any electronic device, including diodes, lasers, passive elements (e.g., inductor, capacitors, resistors), junctions, solar cells, etc. The present principles may be employed on any devices or components that may have an Al—ZnO contact structure with or without an interlayer.

Figure 4:
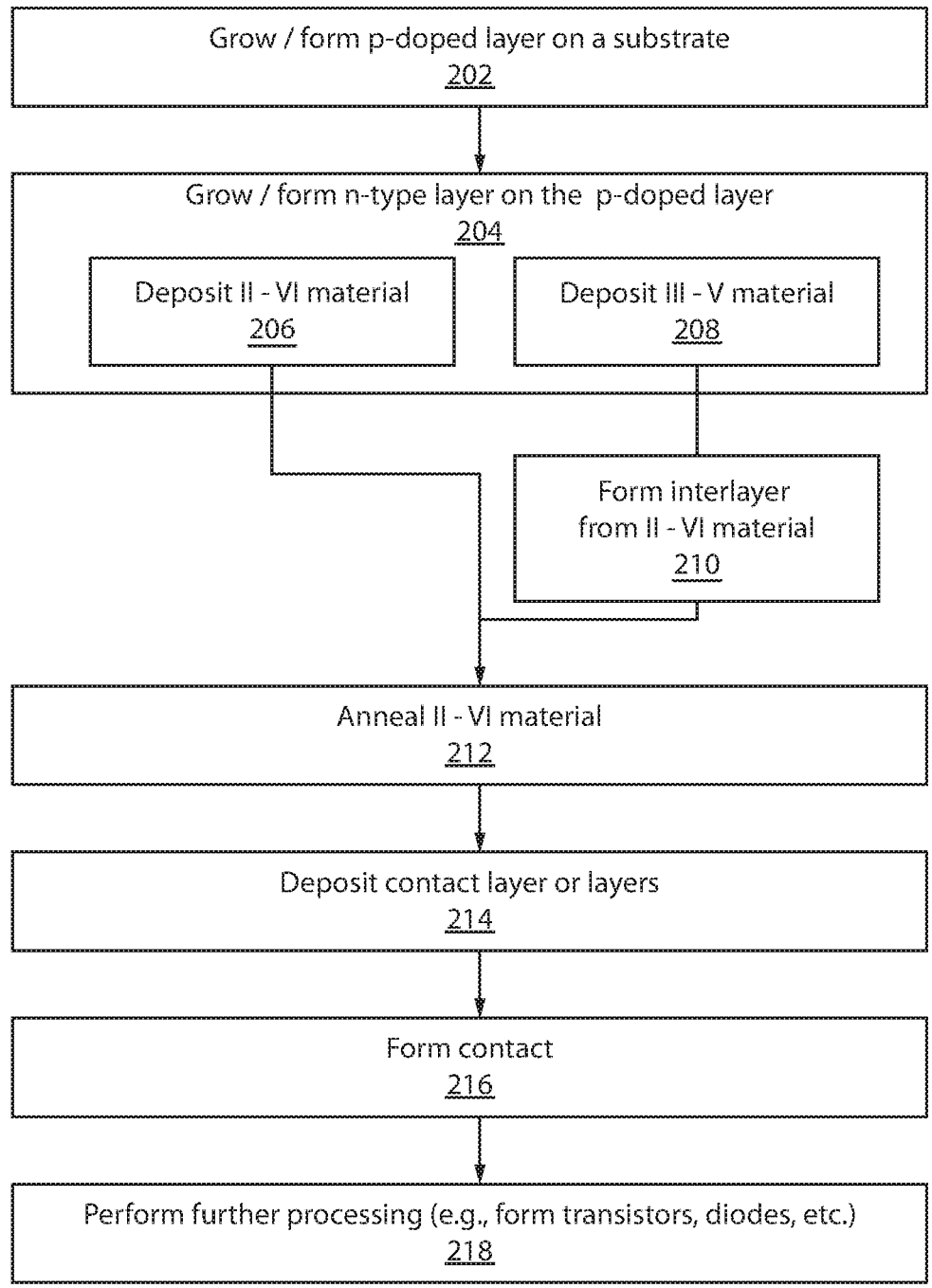
FIG. 4 is a block/flow diagram showing methods for forming a semiconductor device in accordance with illustrative embodiments.

Referring to FIG. 4, a method for forming a semiconductor device is shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, a p-doped layer is grown or formed on a substrate, e.g., III-V substrate, Si substrate, Ge substrate, etc. The p-doped layer preferably includes a III-V material. III-V materials may include, e.g., InP, InAs, AlAs, AN, GaN, InN, AlP, GaP, InP, AlAs, GaAs, InAs, etc. or tertiary compounds, e.g., InGaAs, AlGaAs, etc.

In block 204, an n-type layer/material is grown or formed. In one embodiment, in block 206, the n-type layer includes a doped II-VI material, such as ZnO or ITO formed on the p-doped layer. This formation may include employing an ALD process, MOCVD, sputtering, epitaxial growth, etc. The n-type layer is formed with (or will be processed to have) a carrier concentration of between about $1\times10^{21}$ cm$^{-3}$ to about $5\times10^{21}$ cm$^{-3}$, preferably about $3\times10^{21}$ cm$^{-3}$. This is due to the material and its formation processing. ALD is preferable and results in minimal surface damage to the underlying layers.

In another embodiment, in block 208, the n-type layer includes a doped III-V material, such as InGaAs formed on the p-doped layer. This formation may include employing an ALD process, MOCVD, sputtering, epitaxial growth, etc.

In block 210, an interlayer is formed on the n-type layer (of block 208) and includes a doped II-VI material, such as ZnO or ITO formed on the n-type layer. An interlayer may also be employed on the structure formed in block 206, e.g., on the II-VI material. The formation of an interlayer may include employing an ALD process, MOCVD, sputtering, epitaxial growth, etc. The interlayer is formed with (or will be processed to have) a carrier concentration of between about $1\times10^{21}$ cm$^{-3}$ to about $5\times10^{21}$ cm$^{-3}$, preferably about $3\times10^{21}$ cm$^{-3}$. This is due to the material and its formation processing. ALD is preferable and results in minimal surface damage to the underlying layers. The interlayer may have a thickness of between about 30 nm to about 50 nm, although thinner or thicker dimensions are also contemplated.

In block 212, the II-VI n-type layer and/or the II-VI interlayer may be annealed. These layers preferably include aluminum-doped ZnO. The doping may need to be activated to improve device characteristics. For example, the anneal process may include a rapid thermal anneal (RTA) at between about 200 degrees C. to about 600 degrees C. for less than one minute. In one embodiment, the RTA includes a 300 degree C. anneal for about 30 seconds.

In block 214, a contact layer or contact layers are formed directly on the II-VI n-type layer or on the II-VI interlayer. The contact layer may include an aluminum contact layer formed on the n-type layer or on the II-VI interlayer. The aluminum contact layer may be part of a bi-layer with another metal or metals deposited thereon. The contact layer may be employed as a dopant source to the n-type layer or the II-VI interlayer. The contact layer may be formed by any suitable deposition process, e.g., ALD, sputtering, chemical vapor deposition, etc.

In block 216, the contact layer (or layers) is/are patterned to form the contact. The contact layers (and/or the interlayer) may be concurrently patterned using a mask and an etching process. Alternately, the contact may be formed using a damascene process or other process.

The contacts formed in accordance with the present principles (with or without the interlayer) provide a low resistivity, preferably less than about $5\times10^{-9}$ Ohm-cm$^2$, and more preferably less than about $1.3\times10^{-9}$ Ohm-cm$^2$.

In block 218, further processing may be performed to complete a device. The device may include a transistor, diode, inductor, resistor, capacitor, solar cell, etc. Further processing may include forming a gate structure, metallizations, etc.

Having described preferred embodiments for a low resistance contact for semiconductor devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
    forming a p-doped layer including a doped III-V material directly on a substrate formed from a non-oxide material;
    forming an n-type material on or in the p-doped layer; and
    forming a contact, including a ZnO portion, on the n-type material, wherein the n-type material includes Al doped ZnO, the contact including a ZnO and aluminum interface to reduce contact resistivity to less than about $5\times10^{-9}$ Ohm-cm$^2$.

2. The method as recited in claim 1, wherein the contact includes an aluminum portion.

3. The method as recited in claim 2, wherein forming the contact further comprises depositing the ZnO portion, depositing the aluminum portion and concurrently patterning the ZnO portion and the aluminum portion.

4. The method as recited in claim 1, wherein the n-type material includes a ZnO material and the contact includes aluminum.

5. The method as recited in claim 1, wherein the n-type material forms source and drain regions for a transistor device.

6. The method as recited in claim 1, wherein the contact provides an electrode for an electrical device.

7. The method as recited in claim 1, wherein the contact includes a resistivity of less than about $1.3\times10^{-9}$ Ohm-cm$^2$.

8. The method as recited in claim 1, wherein the n-type material forms source and drain regions for a field effect transistor.

9. The method as recited in claim 1, wherein the n-type material forms a junction with the p-doped layer.

10. A method for forming a semiconductor device, comprising:
    forming a p-doped layer including a doped III-V material directly on a substrate formed from a non-oxide material;
    forming an n-type material on or in the p-doped layer, wherein the n-type material includes Al doped ZnO; and
    forming a contact on the n-type material including an interlayer formed from ZnO and an aluminum portion in direct contact with the ZnO of the interlayer to form an electronic device.

11. The method as recited in claim 10, wherein the interlayer includes Al doped ZnO.

12. The method as recited in claim 10, wherein the contact includes a resistivity of less than about $5\times10^{-9}$ Ohm-cm$^2$.

13. The method as recited in claim 10, wherein the contact includes a resistivity of less than about $1.3\times10^{-9}$ Ohm-cm$^2$.

14. The method as recited in claim 10, wherein the interlayer and the aluminum portion are patterned together to form the contact.

15. The method as recited in claim 10, wherein the n-type material forms source and drain regions for a field effect transistor.

16. The method as recited in claim 10, wherein the n-type material forms a junction with the p-doped layer.

* * * * *